US006820244B2

(12) United States Patent
Lincoln

(10) Patent No.: US 6,820,244 B2
(45) Date of Patent: Nov. 16, 2004

(54) METHODS FOR TESTING AND PROGRAMMING NANOSCALE ELECTRONIC DEVICES

(75) Inventor: Patrick D. Lincoln, Woodside, CA (US)

(73) Assignee: SRI International, Menlo Park, CA (US)

(*) Notice: Subject to any disclaimer, the term of this patent is extended or adjusted under 35 U.S.C. 154(b) by 138 days.

(21) Appl. No.: 10/073,597

(22) Filed: Feb. 11, 2002

(65) Prior Publication Data

US 2002/0174288 A1 Nov. 21, 2002

Related U.S. Application Data

(60) Provisional application No. 60/267,917, filed on Feb. 9, 2001.

(51) Int. Cl.[7] .............................. G06F 17/50; G11C 7/00
(52) U.S. Cl. ....................... 716/4; 716/1; 716/2; 716/3; 365/200
(58) Field of Search .......................... 716/4, 1–3, 5–15; 365/200, 157; 257/40; 702/7, 19

(56) References Cited

U.S. PATENT DOCUMENTS

| | | | | |
|---|---|---|---|---|
| 6,320,200 B1 | * | 11/2001 | Reed et al. | 257/40 |
| 6,322,713 B1 | * | 11/2001 | Choi et al. | 216/38 |
| 6,430,511 B1 | * | 8/2002 | Tour et al. | 702/19 |
| 6,487,106 B1 | * | 11/2002 | Kozicki | 365/153 |
| 6,499,129 B1 | * | 12/2002 | Srinivasan et al. | 716/4 |
| 6,560,758 B1 | * | 5/2003 | Jain | 716/7 |
| 2002/0053063 A1 | * | 5/2002 | Bhattacharya et al. | 716/1 |
| 2003/0058697 A1 | * | 3/2003 | Tour et al. | 365/200 |

OTHER PUBLICATIONS

Reed, M.A., et al "The Design and Measurement of Molecular Electronic Switches and Memories", 2001 IEEE International Solid State Circuits Conference, ISSCC Digest of Technical Papers, Feb. 5–7, 2001 pp. 114–115,437.*

Tour, J.M., et al "Nanocell Logic Gates for Molecular Computing", IEEE Transactions on Nanotechnology, vol. 1, No. 2, Jun. 2002, pp. 100–109.*

* cited by examiner

Primary Examiner—Vuthe Siek
Assistant Examiner—Magid Y. Dimyan
(74) Attorney, Agent, or Firm—Deborah Neville

(57) ABSTRACT

This invention provides methods for discovering a connectivity relationship among external connections to a two dimensional logic cell, such as a nanocell. The connectivity relationships may then be used to derive a logical relationship among the external connections. Knowledge of the logical relationship among the external connections is, in turn, used to program the logic cell. In one embodiment, voltage pulses of alternating polarity and progressively shorter duration are used to program a chain of interconnected devices within a logic cell. Characterization of connectivity, programming, re-programming and dynamic testing of logic cells, including nanocells, and cell assemblies are taught in the inventive method.

43 Claims, 7 Drawing Sheets

METHODS FOR TESTING AND PROGRAMMING NANOSCALE ELECTRONIC DEVICES

PRIORITY INFORMATION

This application claims benefit under 35 U.S.C. §119(e) of the filing date of provisional application Ser. No. 60/267,917, filed on Feb. 9, 2001 and titled "Method for Programming and Verifying Nanoscale Electronic Devices."

BACKGROUND

The invention relates generally to nanoscale electronic devices, and more specifically to methods for testing and programming devices that contain molecular switches.

Over the past few decades, engineering advances have enabled the manufacture of semiconductor devices that have used progressively smaller transistors. Although this trend is likely to continue for the next few years, most researchers in the semiconductor industry believe that it will be impractical to manufacture transistors smaller than about 120 nanometers in length.

Researchers in the relatively new field of molecular electronics have been working to develop electronic devices using molecules that act as switches and memory devices. Because molecular switches are much smaller than even the smallest semiconductor transistor, researchers in this field believe that it will be possible to manufacture microprocessors and other computing devices that are much smaller and more powerful than would be possible using conventional semiconductor technology.

Although great advances have been made in the development of molecular switches and memory elements, these molecules have not yet been integrated into a practical device. One team of researchers, which includes J. M. Tour of Rice University and M. A. Reed of Yale University, has proposed integrating semi-randomly assembled molecular switches into "nanocells" that act as arrays of logic gates. Thousands or millions of nanocells could be manufactured on a single chip.

As is shown in FIG. 1, a nanocell 100 is a small region (perhaps a square of 1 micron per side) on an insulating layer 101 and within this region many metallic and/or semiconducting nanoparticles 102 are bonded to the insulating layer and interconnected in a semi-random manner by molecular switches 104. Signals are transmitted to and from the nanocell via external connections 106.

It is impossible to predict a priori how the nanoparticles (and thus the external connections) will be interconnected by the molecular switches. Nanocell architecture is significantly different from more conventional architectures in that nanocell fabrication must be followed by device discovery and programming procedures. After fabrication, the logical relationship among the nanocell's external connections must be determined. In addition, the nanocell must be programmed to enable it to perform a useful computational function. Theoretically, a Scanning Tunneling Microscope or an Atomic Force Microscope could be used to view and potentially influence the interconnections between the various nanoparticles and external connections. Such techniques would prove entirely impractical for large-scale devices with thousands or millions of nanocells.

Moreover, even where it may be possible to determine the logical relationship among external connections to a nanocell, it remains necessary to program the nanocell in order to ensure that its external connections have a useful logical relationship. It may also be necessary to "reprogram" or modify the nanocell so that its external connections assume different logical relationships. For example, a nanocell that acts as a logical "AND" gate may need to be reprogrammed to operate as an adder or a "NAND" gate. Given the nanocell's relatively small number of external connections and large number of molecular switches, conventional addressing and programming techniques fail to produce operable, programmed nanocells or nanocell based devices.

SUMMARY

This invention provides methods for discovering a connectivity relationship among external connections to a two dimensional logic cell, such as a nanocell. In one embodiment, a voltage is applied to a selected, contiguous set of one or more of the external connections. The total current flow (TCF) received by the remainder of the external connections is measured; if the measured total current flow (TCF) falls below a threshold value (TV), that contiguous set of external connections is grouped together and thereafter treated as a single connection. These steps may be repeated for different contiguous sets of external connections until the desired level of characterization has been determined.

When a sufficient number of contiguous sets have been selected and tested according to the invention, the resultant connection groupings may then be used to derive the logical relationship among the external connections. In one embodiment, the connection groupings are used to generate a model of the logical relationships among the external connections represented as a Boolean expression using an Ordered Binary Decision Diagram (OBDD).

Alternate embodiments relate to methods for programming a series of interconnected devices, including the case in which the series of interconnected devices is a series of molecular switches contained within a nanocell. In one embodiment, a first voltage pulse is applied to an input to the interconnected devices, most or all of which are in an initial or first state. This first voltage pulse has a polarity, magnitude and time duration sufficient to cause a number of the devices to switch to a second state. A second voltage pulse of a shorter duration and opposite polarity may then be applied to the input thereby causing some of the previously switched devices to return to the first state. Subsequent voltage pulses of alternating polarity and progressively shorter duration may then be applied to the input until the programming is complete. Logic cells, including nanocells, programmed by the inventive methods are considered to be taught in this invention.

DETAILED DESCRIPTION

Discovery of Connectivity within a Logic Cell

Figure 1:
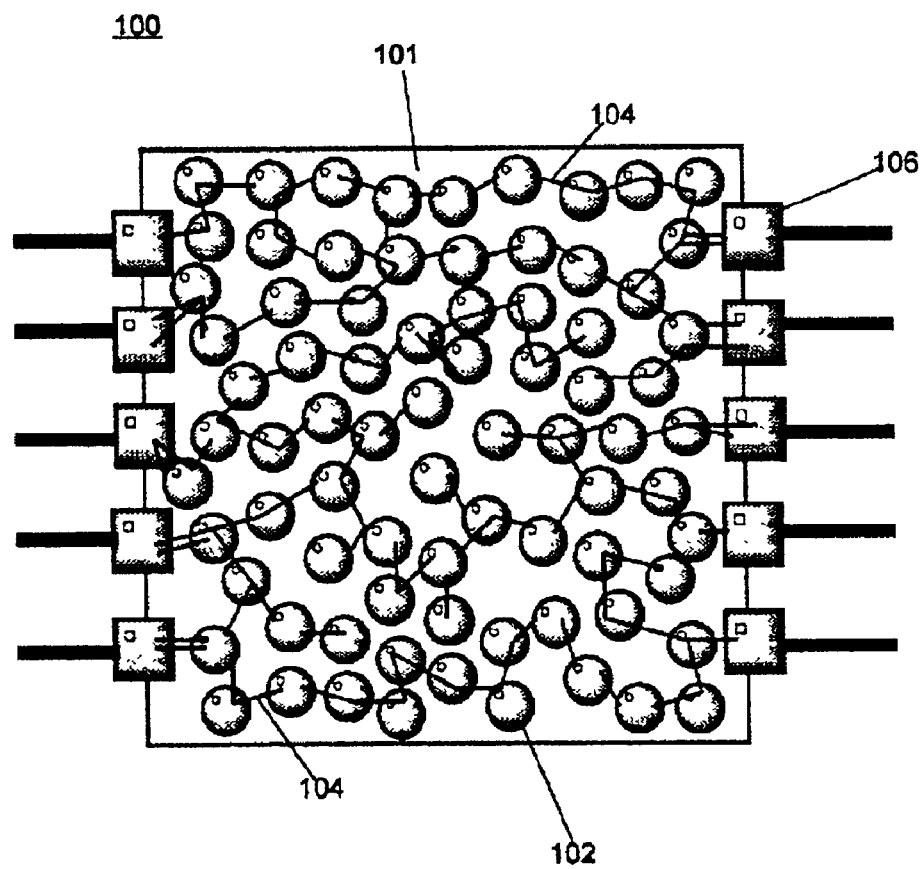
FIG. 1 depicts an example of a nanocell.

As is shown in FIG. 1, a typical nanocell includes semiconducting/metallic nanoparticles 102 and external connections 106 that are randomly interconnected by molecular switches 104. Several thousand or million nanocells may be fabricated on a single chip, so the nanocells are preferably regular polygons that can be used to tile a plane such as squares, hexagons, or triangles. Square nanocells with between four and twenty external connections may turn out to be the most practical configuration.

For a nanocell to be useful as a logic device, the logical relationship among its external connections must be known. However, it is impossible to predict prior to assembly and testing how the molecular switches in any particular nanocell will interconnect that cell's nanoparticles and external connections. While discovery of the placement of each molecular switch within a nanocell is not possible, it is possible to model the connectivity relationships among the cell's external connections. Further, it is possible to derive the logical relationships among the cell's external connections once the connectivity relationships are known.

Figure 2:
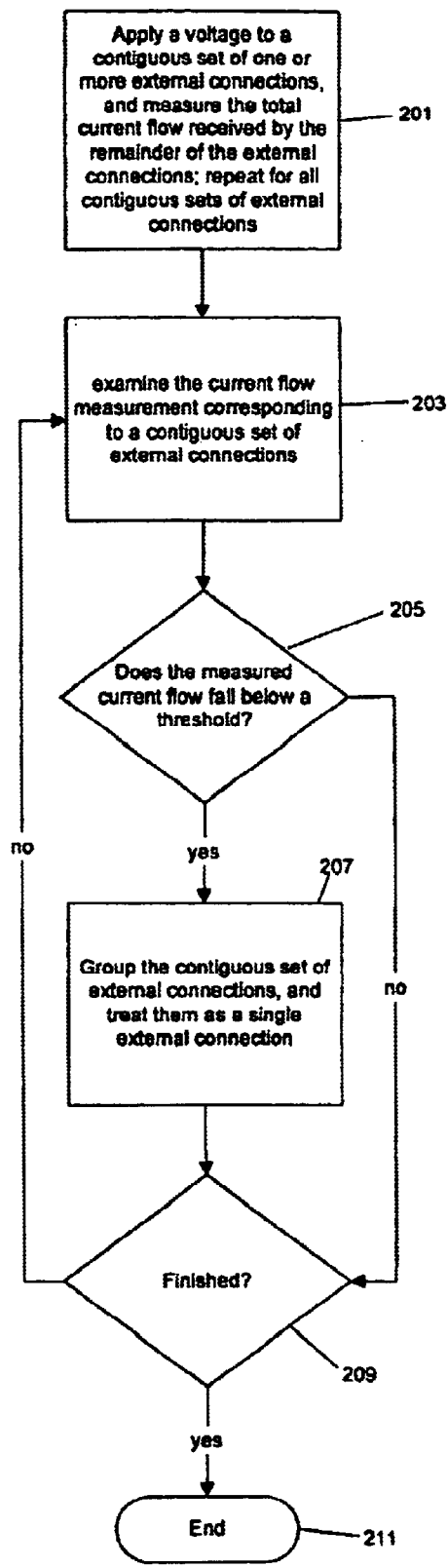
FIG. 2 is a flowchart illustrating a preferred method for discovering connectivity relationships among the external connections to a logic cell such as a nanocell.

FIG. 2 illustrates a preferred method for discovering or modeling the connectivity relationships among a logic cell's external connections The method provides for dividing the nanocell into groups of contiguous external connections that are relatively electrically isolated from each other. The initial step (201) is applying a voltage to a contiguous set of one or more of the cell's external connections and measuring the total current flow (TCF) received by the remainder of the external connections. For example, a voltage might be applied to the top two connections 106 on the right side of the nanocell depicted in FIG. 1, and the total current flowing to all of the other external connections would be measured. This selection of contiguous external connections, voltage application and measurement of total current flow 201 may be repeated for all contiguous sets of external connections to the nanocell.

Next, a current flow measurement corresponding to a contiguous set of external connections is examined 203 by comparing the measured value of the total current flow (TCF) against a threshold value (TV) If the measured value of total current flow is less than a threshold value (TV) 205, the contiguous set of external connections can be grouped together and treated as a single external connection for other process steps 207. In the preferred embodiment, the current threshold value (TV) depends on both the measured current TCF and on the number of contiguous external connections in the set corresponding to the measurement. According to this invention, the current threshold value may be predetermined and remain at the same value throughout the process or the threshold value may be dynamically determined during the process. Steps 201–209 may then be repeated for different sets of external connections. When all relevant combinations of contiguous external connections have been thus tested, the process has been completed 211.

In an alternate embodiment (not shown), the comparison of a measured total current flow value TCF against a threshold value TV and the grouping of contiguous sets for which the TCF value is less that the threshold value TV may be performed after each measurement of TCF rather than after all of the TCF measurements have been taken.

It should be understood that in addition to TCF as a selected measurement for connectivity characterization, any meaningful current, voltage or impedance measurement can be employed according to the inventive method taught herein.

These groupings of external connections may then be used to derive logical relationships among the logic cell's external connections. These relationships are encoded in a Boolean Propositional Logic representation. In the preferred embodiment, these groupings are used to generate Ordered Binary Decision Diagrams (OBDDs). According to a discussion in Bryant, "Symbolic Boolean Manipulation with Ordered Binary-Decision Diagrams," ACM Computing Surveys, Vol. 24, No. 3, September 1992, p. 293–316, OBDDs represent Boolean functions as directed acyclic graphs. Such acyclic graphs provide a canonical representation useful in simplifying tests of logical equivalence and other properties.

Figure 3:
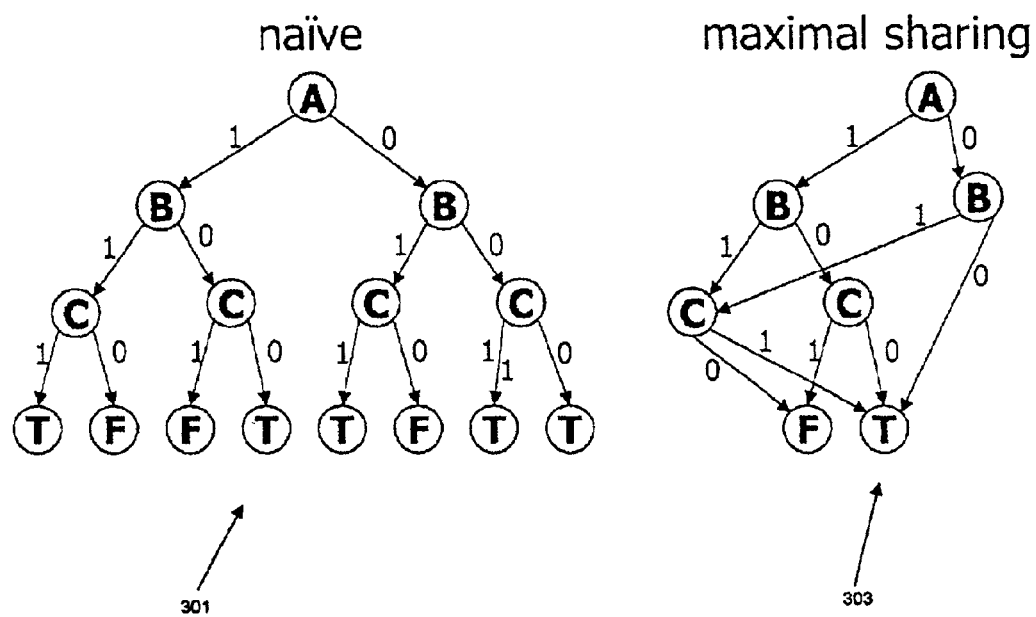
FIG. 3, inclusive, is a diagram illustrating a Binary Decision Diagram (BDD) that represents a group of logic functions, and a more compact Ordered Binary Decision Diagram (OBDD) representing the same group of logic functions.

FIG. 3 shows an example of a standard binary tree 301 that represents logical relationships among three variables A, B and C. The OBDD 303 represents the same logical relationships in a much more compact form.

Figure 4:
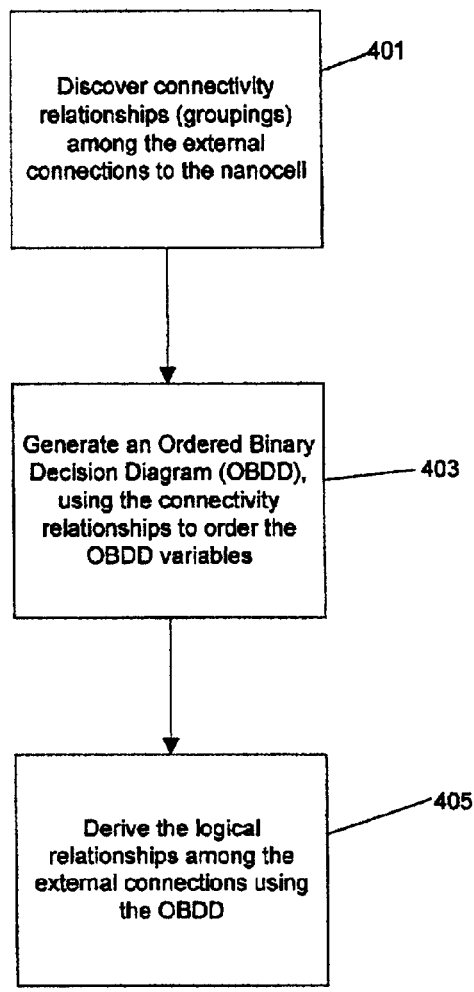
FIG. 4 is a flowchart illustrating a preferred method for discovering the logical relationships among the external connections to a logic cell such as a nanocell.

FIG. 4 is a flowchart that illustrates a preferred method for deriving the logical relationship among the external connections to a logic cell. The first step 401 in this process is to discover the connectivity relationships of the cell's external connections. This step may be performed using the process shown in FIG. 2 and described herein above.

Next, an OBDD is generated using the groupings of external connections to order the OBDD variables 403. Preferably, the variables describing the logical connectivity are ordered so as to minimize the eventual OBDD. Techniques for generating variable orderings and OBDDs are described in the literature and are generally known to those skilled in the relevant art, and any of these are contemplated for use in this invention. Finally, the logical relationship among the cell's external connections may be derived from the resulting OBDD 405.

Programming the Logic Cell

After the logical relationship among the nanocell's external connections have been discovered, the nanocell can be programmed to perform some useful logic or computational function. It may also be desirable to modify or to "reprogram" a nanocell so that its external connections have a different logical relationship. For example, a nanocell that acts as a logical "AND" gate may need to be reprogrammed to act as an adder or a "NAND" gate. Large nanocells that encode other logical functions such as adders and comparators may also be reprogrammed to function in new and different ways. Given the nanocell's relatively small number of external connections and large number of molecular switches, nanocell programming can be presumed to be impractical or impossible using conventional addressing and programming techniques.

Several different potentially useful molecular switches are known. One particularly useful class of molecules that act as switchable diodes exhibits a characteristic called "negative differential resistance", or "NDR". For some range of input voltages, these molecules pass current in only one direction. However, when the input voltage continues to increase past a threshold, the amount of current passed begins to drop, and ultimately the molecules will switch states. The molecules will then pass current only in the opposite direction. It is important to note that several molecules exhibiting NDR with different threshold voltage have been identified. Nanocells could be constructed with multiple types of such molecules in order that advantage be taken of different threshold voltages. In such nanocells, discovery and programming of the lower threshold molecules could proceed separately from either or both discovery or programming of the higher threshold molecules.

Figure 6:
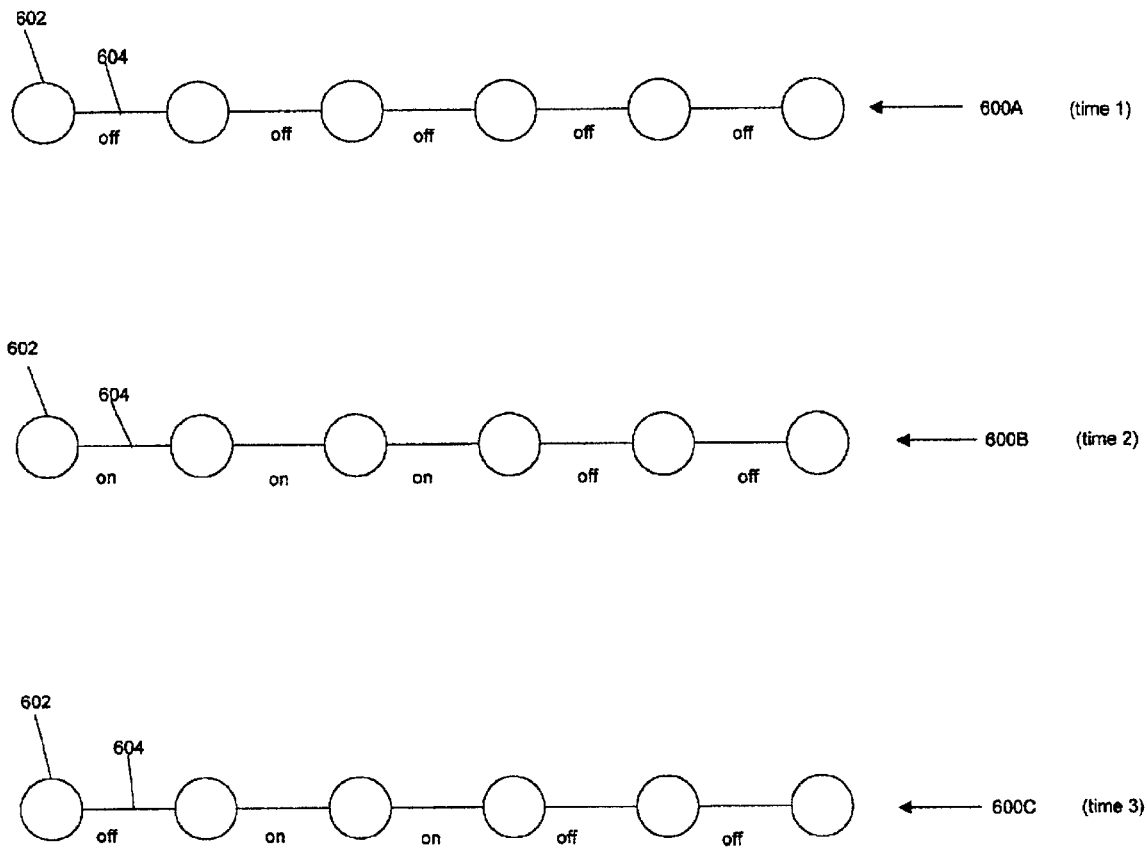
FIG. 6, inclusive, shows an example of programming a chain of switchable devices according to the method illustrated by FIG. 5.

FIG. 6 depicts a series 600A of switchable molecules 604 that interconnect semiconducting or metallic nanoparticles 602. These nanoparticles have a very small capacitance that may be "charged up" or "drained" when voltage of an appropriate polarity, magnitude and time duration is applied. Therefore, when a nanoparticle reaches a sufficient voltage, it will cause the adjacent molecular switch to change states. By applying a timed sequence of voltage pulses of alternating polarity it is possible to set the states of all of the molecular switches in the chain. (The linear depiction of a chain-like structure is intended for simplicity and clarity of explanation; it is intended that any interconnected structures amenable to this method be included in the scope of this invention, regardless of the specific example chosen to illustrate this invention.) The term adjacent may be understood to mean operable coupled. Interconnectedness at this level must be interpreted in the broadest functional manner.

Figure 5:
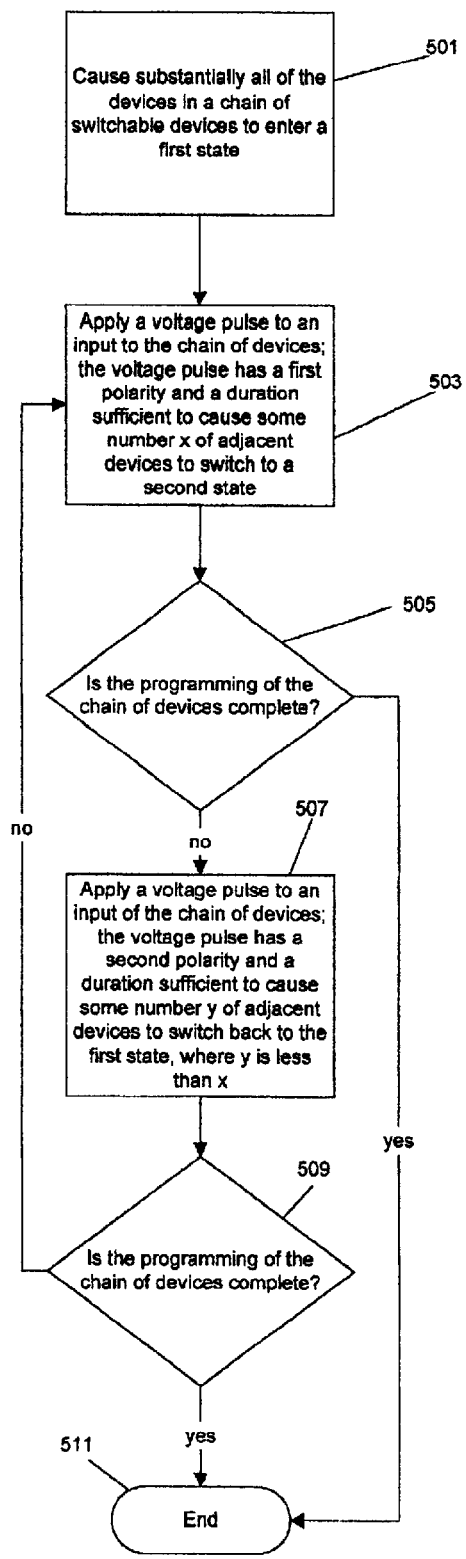
FIG. 5 is a flowchart illustrating a preferred method for programming a chain of switchable devices such as the molecular switches within a nanocell.

FIG. 5 illustrates a preferred method for programming an interconnected series of switchable devices such as molecular switches (as are depicted in FIG. 6). Initially (501) substantially all of the devices in the series must be in or caused to enter an initial or first state. For example, all of the molecular switches 604 in chain 600A of FIG. 6 are in an "off" state. It may be possible to set all of the molecular switches in a series to the same state by using electromagnetic radiation, or by using the cell's external connections to set the state of large groups of molecules, or by some other means.

Next, a first voltage pulse is applied to an input to the series of devices 503. This first voltage pulse has a first polarity, magnitude and duration sufficient to cause some number x of adjacent devices to switch to a second state. For example, applying a positive voltage pulse to the leftmost nanoparticle 602 of series 600B causes the three leftmost nanoparticles to "charge up" and rise in voltage enough to switch the three leftmost molecular switches 604 from "off" to "on."

If additional molecular switches need to be programmed 505, a second voltage pulse is applied to the series input 507. This second voltage pulse is opposite in polarity relative to the previous or first pulse, and is of a magnitude and duration sufficient cause some number y of devices to switch back to the first state, where y is less than x. For example, a negative voltage pulse applied to the leftmost nanoparticle of chain 600C would cause that nanoparticle to "discharge" and take on a negative voltage of sufficient magnitude to switch the left most molecular switch 604 back to an "off" state. Steps 501–509 may be repeated until the chain of devices has been programmed as desired and the process ends 511. The number of molecules that are programmed during each voltage pulse may be predetermined or dynamically determined.

The practitioner of average skill can envision without significant difficulty the embodiment wherein molecular switches of differing switching potentials within the same series can be addressed.

Although the embodiments set forth herein teach direct pulse input for characterization of interconnectivity and programming and test of a nanocell or two dimensional logic cell, it is also within the scope of this invention to program a nanocell by and through its neighboring nanocells. The principles necessary to accomplish such application of the inventive methods are generally understood to the practitioner of average skill in the relevant arts.

Figure 7:
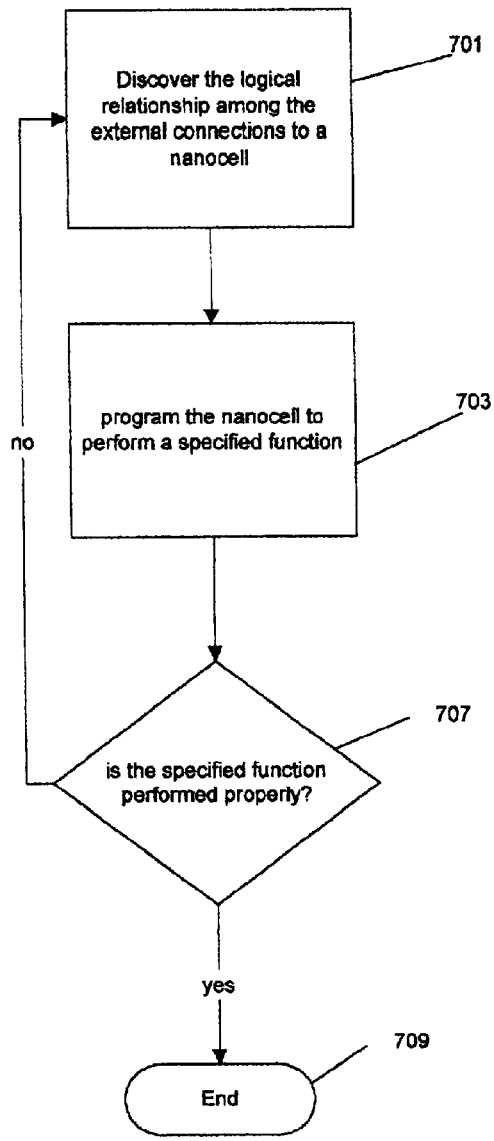
FIG. 7 is a flowchart illustrating a preferred method for programming and testing a logic cell such as a nanocell.

After the programming process is complete, the programmed nanocell can be tested to determine if it performs the desired function. FIG. 7 is a flowchart illustrating how the discovery 701 and programming 703 methods described above may be repeated until the nanocell performs the desired function 705, 707. Specifically, the discovery and programming process can be repeated using additional information that is available at each iteration from earlier failed attempts to program the nanocell. Each iteration of the process shown in FIG. 7 can re-use the data structures and algorithms outlined above to refine the models and characterization of the nanocell's configuration and state.

In situ testing is possible of logic cells, including nanocells, and assemblies of cells according to the principles set forth in this invention. Moreover, modification, testing, and re-programming can be accomplished in functioning logic cells, including nanocells, and cell assemblies.

Although preferred embodiments have been discussed above, the scope of this invention is defined by the claims and the equivalences thereto.

I claim:

1. A method for discovering a connectivity relationship among a plurality of external connections to a two dimensional logic cell, the method comprising the steps of:
    (a) for all contiguous sets of one or more of the external connections, applying a voltage to each contiguous set and measuring a total current flow received by the remainder of the external connections;
    (b) examining a current flow measurement corresponding to a contiguous set of the external connections;
    (c) grouping the contiguous set of external connections if the measured current flow falls below a threshold; and
    (d) repeating steps (b)–(c) for different contiguous sets of external connections.

2. The method of claim 1 wherein each previously grouped set of external connections is treated as a single external connection.

3. The method of claim 1 further comprising the step of using the connection groupings to discover a logical relationship among the external connections.

4. The method of claim 3 wherein the connection groupings are used to generate an ordered binary decision diagram (OBDD).

5. The method of claim 4 wherein the connection groupings comprise a set of variables and orderings on those variables that are used to generate the OBDD.

6. The method of claim 1 wherein the current flow threshold is predetermined.

7. The method of claim 1 wherein the current flow threshold is dynamically determined.

8. The method of claim 1 wherein the logic cell is a nanocell.

9. The method of claim 8 wherein the nanocell is a regular polygon.

10. The method of claim 9 wherein the regular polygonal nanocell is further characterized by one or more external connections on one or more sides of the polygon.

11. The method of claim 9 wherein each side of the polygonal nanocell has at least one external connection.

12. The method of claim 9 wherein the nanocell has at least 20 external connections.

13. The method of claim 9 wherein the nanocell has at least 4 external connections.

14. The method of claim 9 wherein the nanocell includes an assembly of nanocells which are of one or more planar geometries.

15. The method of claim 14 wherein discovery of connectivity relationships is at least partially effected by or through neighboring nanocells.

16. A device containing at least one logic cell programmed by the method of claim 1.

17. A method for discovering a connectivity relationship among a plurality of external connections to a two dimensional logic cell, the method comprising the steps of:

(a) applying a voltage to a contiguous set of one or more of the external connections;

(b) measuring a total current flow received by the remainder of the external connections;

(c) grouping the contiguous set of external connections if the measured current flow falls below a threshold; and (d) repeating steps (a)–(c) for different contiguous sets of external connections.

18. A method for programming a series of interconnected devices, wherein the devices are two-dimensional logic cells, and wherein each device is capable of assuming at least two stable states, the devices initially being in a first state, the method comprising the step of:

applying a voltage pulse to an input to the devices, the voltage pulse having a first polarity and a time duration sufficient to cause a number x (where x is greater than 1) of devices to switch to a second state.

19. The method of claim 18 further comprising the step of applying a second voltage pulse to the input, the second pulse having a second polarity and a duration sufficient to cause a number y of devices to return to the first state, where y is less than x.

20. The method of claim 19 further comprising the step of applying subsequent voltage pulses to the input, the subsequent voltage pulses having alternating polarity and progressively shorter duration.

21. The method of claim 20 wherein the numbers x and y are predetermined.

22. The method of claim 20 wherein the numbers x and y are dynamically determined.

23. The method of claim 18 wherein the interconnected devices are molecular switches having a characteristic negative differential resistance.

24. The method of claim 18 wherein the logic cell includes switching devices of different switching potentials.

25. The method of claim 18 further including the step of devices assuming a known state at some time subsequent to the application of the first pulse.

26. The method of claim 18 wherein the interconnected devices are molecular switches within nanocells, and wherein logic cell programming is at least partially effected by or through neighboring nanocells.

27. A device containing at least one logic cell programmed by the method of claim 18.

28. A method for re-programming a series of interconnected devices, wherein the devices are two-dimensional logic cells, and wherein each device is capable of assuming at least two stable states, the devices initially being in an operational state, the method comprising the step of:

applying a voltage pulse to an input to the devices, the voltage pulse having a first polarity and a time duration sufficient to cause a number x of devices to switch to a second state.

29. A device containing at least one logic cell programmed by the method of claim 28.

30. A method for programming a logic cell having a plurality of external connections interconnected by a plurality of switching devices, the method comprising the steps of:

(a) discovering a logical relationship among the external connections to the logic cell;

(b) programming the switchable devices to perform a logic function by using a series of voltage pulses having alternating polarity and progressively shorter duration;

(c) testing the logic cell to determine if it performs the programmed logic function;

(d) repeating steps (a)–(c) as necessary to ensure the logic cell performs the programmed logic function.

31. A device containing at least one logic cell programmed by the method of claim 30.

32. A method for programming a logic cell having a plurality of external connections interconnected by a plurality of switching devices, the method comprising the steps of:

(a) discovering a logical relationship among the external connections to the logic cell;

(b) programming the switchable devices to perform a logic function by using a series of voltage pulses having alternating polarity and progressively shorter duration, where the sequence of duration, voltages and choice of inputs on which to signal those sequences of voltages is chosen based on a logical representation of connectivity within the logic cell;

(c) testing the logic cell to determine if it performs the programmed logic function.

33. The method of claim 32 wherein the logic cell comprises one or more nanocells.

34. A device containing at least one logic cell programmed by the method of claim 33.

35. A device containing at least one logic cell programmed by the method of claim 32.

36. A method of re-programming, modifying or repairing a logic cell having a plurality of external connections interconnected by a plurality of switching devices, the method comprising the steps of:

(a) determining the operable function of the logic cell;

(b) re-programming the switchable devices to perform a selected logic function by using a series of voltage pulses having alternating polarity and progressively shorter duration; and (c) confirming operability of the programmed logic cell.

37. The method of claim 36 further characterized by performance of the steps after and during such time as the logic cell has commenced an operational mode.

38. The method of claim 36 wherein the voltage pulses are selected so as to preferentially influence a subset of the switching device types according to the threshold potential of that subset.

39. A device containing at least one logic cell programmed by the method of claim 36.

40. A method of re-programming, modifying or repairing a logic cell, including the case where such logic cell is a nanocell, such logic cell having a plurality of external connections interconnected by a plurality of switching devices, the method comprising the steps of:

(a) determining the operable function of the logic cell;

(b) re-programming the switchable devices to perform a selected logic function by using a series of voltage pulses having alternating polarity and progressively shorter duration, and where the sequence of duration, voltages and choice of inputs on which to signal those sequences of voltages is chosen based on a logical representation of connectivity within the logic cell; and (c) confirming operability of the programmed logic cell.

41. The method of claim 40 further characterized by performance of the steps after and during such time as the logic cell has commenced an operational mode.

42. The method of claim 40 wherein the voltage pulses are selected so as to preferentially influence a subset of the switching device types according to the threshold potential of that subset.

43. A device containing at least one logic cell programmed by the method of claim 40.

* * * * *